US012690295B2

(12) United States Patent
Choi et al.

(10) Patent No.: US 12,690,295 B2
(45) Date of Patent: Jul. 21, 2026

(54) EPITAXY STRUCTURE INCLUDING A PLURALITY OF SEMICONDUCTOR DEVICES

(71) Applicant: SAMSUNG DISPLAY CO., LTD., Yongin-si (KR)

(72) Inventors: Junhee Choi, Seongnam-si (KR); Kiho Kong, Suwon-si (KR); Nakhyun Kim, Yongin-si (KR); Joosung Kim, Seongnam-si (KR); Younghwan Park, Seongnam-si (KR); Junghun Park, Yongin-si (KR); Dongchul Shin, Suwon-si (KR); Eunsung Lee, Seoul (KR); Joohun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 663 days.

(21) Appl. No.: 17/720,872

(22) Filed: Apr. 14, 2022

(65) Prior Publication Data

US 2023/0143907 A1     May 11, 2023

(30) Foreign Application Priority Data

Nov. 10, 2021     (KR) ........................ 10-2021-0154295

(51) Int. Cl.
*H10H 20/84*          (2025.01)
*H10H 20/811*         (2025.01)
          (Continued)

(52) U.S. Cl.
CPC ........ *H10H 20/811* (2025.01); *H10H 20/821* (2025.01); *H10H 20/84* (2025.01); *H10H 29/142* (2025.01)

(58) Field of Classification Search
CPC ............. H01L 33/52–56; H01L 51/448; H01L 51/5209; H01L 27/3262; H01L 27/3258;
          (Continued)

(56) References Cited

U.S. PATENT DOCUMENTS 6,204,180 B1     3/2001  Tom et al.
2004/0060518 A1  4/2004  Nakamura et al.
          (Continued)

FOREIGN PATENT DOCUMENTS

CN          110010729 A     7/2019
KR     10-2009-0054009 A    5/2009
          (Continued)

OTHER PUBLICATIONS

Sang-Hoon Bae et al., "Graphene-assisted spontaneous relaxation towards dislocation-free heteroepitaxy", Nature Nanotechnology, vol. 15, 2020, 6 pages total.
          (Continued)

*Primary Examiner* — Moin M Rahman
(74) *Attorney, Agent, or Firm* — Sughrue Mion, PLLC

(57)          ABSTRACT

Provided is an epitaxy structure including a substrate having an upper surface, the upper surface having a single crystal structure, a two-dimensional material layer disposed on the upper surface of the substrate, and a plurality of nanorod light emitting devices disposed on an upper surface of the two-dimensional material layer, each of the plurality of nanorod light emitting devices having a nanorod shape extending in a vertical direction, wherein each of the plurality of nanorod light emitting devices includes a light emitting nanorod, and a passivation film disposed adjacent to a sidewall of the light emitting nanorod, the passivation film having insulation.

22 Claims, 21 Drawing Sheets

(51) Int. Cl.
H10H 20/821 (2025.01)
H10H 29/14 (2025.01)

(58) Field of Classification Search
CPC .............. H01L 27/3248; H01L 27/322; H01L 51/5225; H01L 51/5268; H01L 2251/558; H01L 2251/303; H01L 2251/306; H01L 2251/308; H01L 51/5218; H01L 51/5271; H01L 51/5275; H01L 51/0005; H01L 51/5012; H01L 51/5206; H01L 51/5221; H01L 51/56; H01L 27/3244; H01L 2227/323; H01L 25/167; H01L 33/04; H01L 27/156; H01L 33/24; H01L 33/44; H01L 33/08; H01L 33/12; H01L 33/16; H01L 29/16–1608; H01L 29/66045; H01L 29/1602; H01L 29/1606; H01L 29/0669–068; H01L 29/0665; H01L 2924/13061; H01L 29/66439; H01L 29/66469; H01L 29/78687; H01L 29/78696; H01L 25/0753; H01L 24/75; H01L 24/98; H01L 2221/68322; H01L 2221/68354; H01L 2224/75822; H01L 2224/7598; H01L 2924/12041; H01L 21/6835; H01L 24/95; Y10S 977/938; H10H 20/8312; H10H 20/01; H10H 20/857; H10H 20/032; H10H 20/0364; H10H 20/0363; H10H 20/855; H10H 20/819; H10H 20/856; H10H 20/82; H10H 20/831; H10H 20/00–882; H10H 29/00–142; H10H 29/30–962; H10H 20/814–8142; H10H 20/0145; H10H 20/826–8262; H10H 20/013–0137; H10H 20/824–8252; H10H 20/012–0125; H10H 20/823–8232; H10H 20/0165; H10H 20/817–818; H10H 20/052; H10H 20/821; H10H 20/811; H10H 20/84; H10H 20/813; H10H 20/815; F21K 9/00–278
See application file for complete search history.

(56) References Cited

U.S. PATENT DOCUMENTS

| | | | |
|---|---|---|---|
| 2009/0140267 A1 | 6/2009 | Kim | |
| 2010/0311229 A1* | 12/2010 | Einav ................. | H01J 37/3053 |
| | | | 438/483 |
| 2011/0256645 A1 | 10/2011 | Tam et al. | |
| 2013/0112944 A1* | 5/2013 | Cha ........................ | B82Y 20/00 |
| | | | 977/932 |
| 2015/0357418 A1* | 12/2015 | Lee ..................... | H01L 29/2003 |
| | | | 257/76 |
| 2016/0020358 A1* | 1/2016 | Lee ......................... | H01L 33/08 |
| | | | 257/13 |
| 2016/0233383 A1 | 8/2016 | Matias et al. | |
| 2019/0189840 A1* | 6/2019 | Tsai ................. | H01L 21/02381 |
| 2020/0066954 A1* | 2/2020 | Kuo ..................... | H10H 20/852 |
| 2021/0115589 A1 | 4/2021 | Journot et al. | |
| 2021/0159314 A1 | 5/2021 | Choi et al. | |
| 2021/0167124 A1 | 6/2021 | Min et al. | |
| 2021/0217617 A1* | 7/2021 | Robinson .......... | H01L 31/03044 |
| 2022/0052236 A1 | 2/2022 | Munshi et al. | |
| 2022/0149238 A1 | 5/2022 | Wang et al. | |
| 2022/0231081 A1* | 7/2022 | Kim ..................... | H10H 20/825 |

FOREIGN PATENT DOCUMENTS

| | | | |
|---|---|---|---|
| KR | 10-2017-0115617 A | 10/2017 |
| KR | 10-1845756 B1 | 4/2018 |
| KR | 10-2019-0115699 A | 10/2019 |
| KR | 10-2020-0015871 A | 2/2020 |
| KR | 10-2021-0062028 A | 5/2021 |
| KR | 10-2021-0064012 A | 6/2021 |

OTHER PUBLICATIONS

Office Action dated Sep. 18, 2025, issued by Korean Patent Office in Korean Patent Application No. 10-2021-0154295.
Office Action issued Apr. 14, 2026 by the Korean Ministry of Intellectual Property for KR Patent Application No. 10-2021-0154295.

* cited by examiner

EPITAXY STRUCTURE INCLUDING A PLURALITY OF SEMICONDUCTOR DEVICES

CROSS-REFERENCE TO RELATED APPLICATION

This application is based on and claims priority under 35 U.S.C. § 119 to Korean Patent Application No. 10-2021-0154295, filed on Nov. 10, 2021, in the Korean Intellectual Property Office, the disclosure of which is incorporated by reference herein in its entirety.

BACKGROUND

1. Field

Example embodiments of the present disclosure relate to an epitaxy structure including a plurality of semiconductor devices fabricated using remote epitaxy technology.

2. Description of Related Art

A light emitting diode (LED) with low power consumption and eco-friendliness is known as a next-generation light source having advantages such as long lifespan, low power consumption, fast response speed, and environmental friendliness compared to conventional light sources, and because of these advantages, industrial demand is increasing. LEDs are generally applied and used in various products such as lighting devices and backlights of display devices.

Recently, micro-units or nano-units of micro LEDs using group II-VI or group III-V compound semiconductors have been developed. In addition, micro LED displays in which such micro LEDs are directly applied as light emitting elements of display pixels are being developed. However, when the LED is miniaturized in a micro unit or a nano unit as described above, the luminous efficiency of the LED may be lowered.

SUMMARY

One or more example embodiments provide an epitaxy structure including a plurality of semiconductor devices manufactured using remote epitaxy technology.

One or more example embodiments also provide an epitaxy structure including a plurality of nanorod light emitting devices having a high-quality single crystal structure.

Additional aspects will be set forth in part in the description which follows and, in part, will be apparent from the description, or may be learned by practice of example embodiments of the disclosure.

According to an aspect of an example embodiment, there is provided an epitaxy structure including a substrate having an upper surface, the upper surface having a single crystal structure, a two-dimensional material layer disposed on the upper surface of the substrate, and a plurality of nanorod light emitting devices disposed on an upper surface of the two-dimensional material layer, each of the plurality of nanorod light emitting devices having a nanorod shape extending in a vertical direction, wherein each of the plurality of nanorod light emitting devices includes a light emitting nanorod, and a passivation film disposed adjacent to a sidewall of the light emitting nanorod, the passivation film having insulation.

The substrate may include a support layer, and a single crystal layer disposed on an upper surface of the support layer.

The support layer may include a crystalline material, and the single crystal layer may include a single crystal of a group III-V compound semiconductor having an ionic bond characteristic or an ionic crystal.

The support layer may include silicon (Si) or sapphire.

The single crystal layer may include at least one single crystal of lithium fluoride (LiF), gallium nitride (GaN), and barium titanate ($BaTiO_3$).

The support layer may include an amorphous material.

The single crystal layer may include at least one of cerium oxide ($CeO_2$), scandium(III) oxide ($Sc_2O_3$), magnesium oxide (MgO), barium oxide (BaO), and bromine nitride (BrN) oriented in a (111) direction, a (001) direction, or a (100) direction.

The single crystal layer may include at least two sub-layers, each of the at least two sub-layers having a thickness of 0.5 nm to 100 nm.

The support layer may include glass or fused silica.

The two-dimensional material layer may include a plurality of nanorods respectively extending from a corresponding light emitting nanorod.

The single crystal layer may include a plurality of nanorods respectively extending from a corresponding light emitting nanorod.

The substrate may include one single layer having a single crystal structure.

The substrate may include at least one single crystal from among 4H—SiC, 6H—SiC, and 3C—SiC.

The two-dimensional material layer may include a plurality of nanorods respectively extending from a corresponding light emitting nanorod.

The two-dimensional material layer may include at least one of graphene, boron nitride, and a transition metal dichalcogenide.

The light emitting nanorod may include a first semiconductor layer disposed on an upper surface of the two-dimensional material layer, the first semiconductor layer being doped with a first conductivity type, a light emitting layer disposed on the first semiconductor layer, a second semiconductor layer disposed on the light emitting layer, the second semiconductor layer being doped with a second conductivity type that is electrically opposite to the first conductivity type; and an electrode disposed on the second semiconductor layer.

The light emitting nanorod may have a height in a range of 1 $\mu$m to 20 $\mu$m, and a diameter in a range of 0.05 $\mu$m to 1 $\mu$m.

The passivation film may include an insulating crystalline material having the same crystalline structure as a crystalline structure of the light emitting layer.

The passivation film may have a lattice matching epitaxial relationship or a domain matching epitaxial relationship with the light emitting layer.

According to another aspect of an example embodiment, there is provided an epitaxy structure including a substrate having an upper surface that has a single crystal structure, an insulating layer disposed on the upper surface of the substrate, a plurality of two-dimensional material layers disposed on the upper surface of the substrate, the plurality of two-dimensional material layers being electrically isolated from each other by the insulating layer, and a plurality of semiconductor devices respectively disposed on the plurality of two-dimensional material layers.

The plurality of semiconductor devices may include different semiconductor materials.

The plurality of semiconductor devices may include any one of a light source, a photodetector, an optical modulator, and an optical amplifier.

According to another aspect of an example embodiment, there is provided a monolithic optical integrated circuit including an epitaxy structure including a substrate having an upper surface that has a single crystal structure, an insulating layer disposed on the upper surface of the substrate, a plurality of two-dimensional material layers disposed on the upper surface of the substrate, the plurality of two-dimensional material layers being electrically isolated from each other by the insulating layer, and a plurality of semiconductor devices respectively disposed on the plurality of two-dimensional material layers, wherein the plurality of semiconductor devices include one of a light source, a photodetector, an optical modulator, and an optical amplifier.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1A:
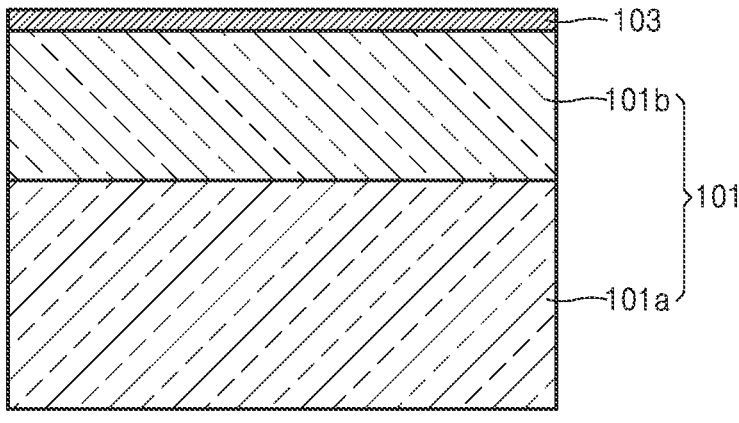
FIGS. 1A, 1B, 1C, 1D, 1E, and 1F are example cross-sectional views illustrating a method of manufacturing an epitaxy structure including a plurality of nanorod light emitting devices according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a nanorod light emitting device, an epitaxy structure including a plurality of nanorod light emitting devices, and a method of manufacturing the epitaxy structure will be described in detail with reference to the accompanying drawings. In the following drawings, the same reference numerals refer to the same components, and the size of each component in the drawings may be exaggerated for clarity and convenience of description. Further, the embodiments described below are merely exemplary, and various modifications are possible from these example embodiments.

Hereinafter, what is described as "upper part" or "on" may include not only those directly above by contact, but also those above non-contact. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

FIGS. 1A to 1F are example cross-sectional views illustrating a method of manufacturing an epitaxy structure including a plurality of nanorod light emitting devices according to an example embodiment.

First, referring to FIG. 1A, a substrate 101 having an upper surface having a single crystal structure is prepared. In addition, a two-dimensional material layer 103 may be formed on the upper surface of the substrate 101. The substrate 101 may include, for example, a support layer 101*a* including a crystalline material and a single crystal layer 101*b* disposed on an upper surface of the support layer 101*a* and having a single crystal material. The single crystal layer 101*b* may be epitaxially grown directly on the upper surface of the support layer 101*a*. The two-dimensional material layer 103 may be disposed on an upper surface of the single crystal layer 101*b*. The support layer 101*a* may include, for example, silicon (Si) or sapphire. The single crystal layer 101*b* may include a single crystal of a group III-V compound semiconductor having an ionic bond characteristic or an ionic crystal. Also, the single crystal layer 101*b* may have the same crystal structure as semiconductor crystals to be described later formed on the two-dimensional material layer 103. For example, the single crystal layer 101*b* may include a single crystal of lithium fluoride (LiF), gallium nitride (GaN), or barium titanate ($BaTiO_3$).

The two-dimensional material layer 103 may include a two-dimensional crystal having a hexagonal structure. For example, the two-dimensional material layer 103 may include graphene, boron nitride (BN), or transition metal dichalcogenide, which is a compound of a transition metal and a chalcogen element. For example, the transition metal dichalcogenide may include molybdenum disulfide ($MoS_2$), tungsten disulfide ($WS_2$), tantalum sulfide ($TaS_2$), hafnium sulfide ($HfS_2$), rhenium sulfide ($ReS_2$), titanium sulfide ($TiS_2$), niobium sulfide ($NbS_2$), tin sulfide ($SnS_2$), molybdenum diselenide ($MoSe_2$), tungsten diselenide ($WSe_2$), tantalum diselenide ($TaSe_2$), hafnium diselenide ($HfSe_2$), rhenium diselenide ($ReSe_2$), titanium diselenide ($TiSe_2$), niobium diselenide ($NbSe_2$), tin diselenide ($SnSe_2$), molybdenum telluride ($MoTe_2$), tungsten telluride ($WTe_2$), tantalum telluride ($TaTe_2$), hafnium telluride ($HfTe_2$), rhenium telluride ($ReTe_2$), titanium telluride ($TiTe_2$), niobium telluride ($NbTe_2$), tin telluride ($SnTe_2$), and the like. The two-dimensional material layer 103 may be transferred as a monolayer or a bilayer on the upper surface of the single crystal layer 101*b*.

When the single crystal layer 101*b* having a polarity by an ion bond exists under the two-dimensional material layer 103, it is possible to directly epitaxially grow a semiconductor crystal on the two-dimensional material layer 103. As the polarity of the single crystal layer 101*b* is stronger, a force that induces the growth of semiconductor crystals on the two-dimensional material layer 103 may be increased. Accordingly, a semiconductor crystal having a predetermined crystal structure according to the crystal direction of the single crystal layer 101*b* may be grown on the two-dimensional material layer 103 without direct chemical bonding with the single crystal layer 101*b* below. In this case, because the stress may be relieved by the two-dimensional material layer 103 as well as not chemically bonded to the single crystal layer 101*b* below, the semiconductor crystal grown on the two-dimensional material layer 103 may be a high-quality single crystal having a relatively low dislocation density. Accordingly, by using the two-dimensional material layer 103, a semiconductor single crystal having a relatively large difference in lattice constant from the substrate 101 may be grown with high quality.

Figure 1B:
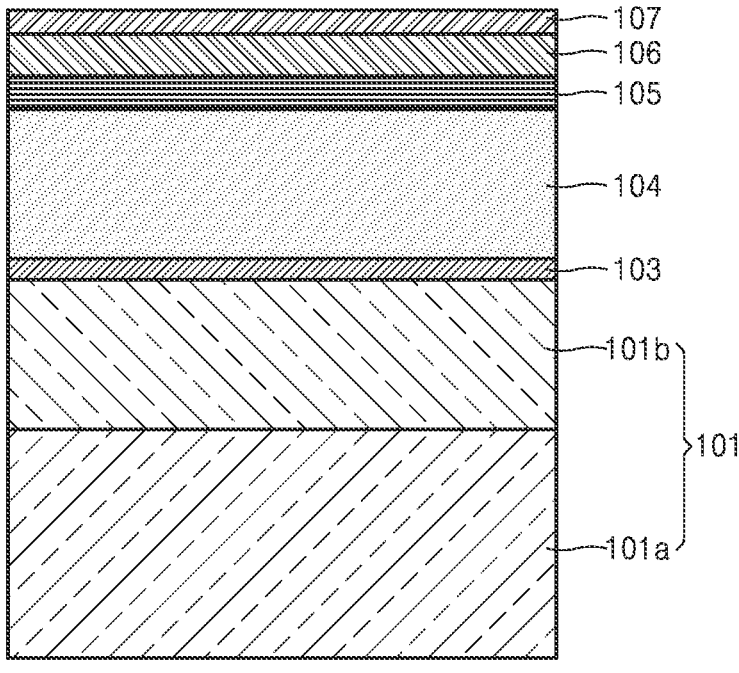
Figure 1C:
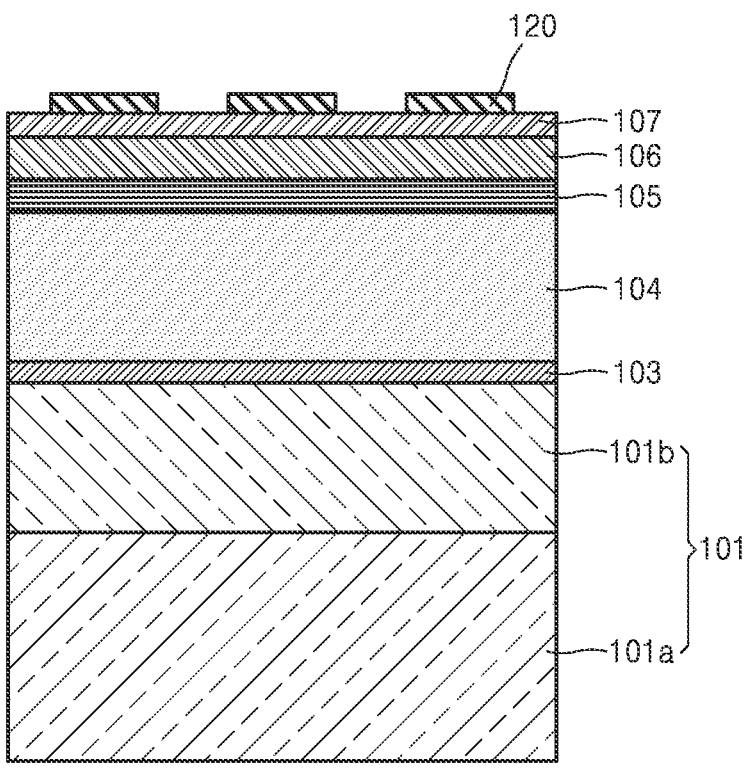

For example, referring to FIG. 1B, a first semiconductor layer 104, a light emitting layer 105, a second semiconductor layer 106, and an electrode 107 may be sequentially grown on the upper surface of the two-dimensional material layer 103. The first semiconductor layer 104 may include a single crystal semiconductor material doped with a first conductivity type, such as an n-type, and the second semiconductor layer 106 may include a single crystal semiconductor material doped with a second conductivity type that is electrically opposite to the first conductivity type, such as a p-type. For example, the first semiconductor layer 104 may be doped with silicon (Si) and the second semiconductor layer 106 may be doped with zinc (Zn).

The light emitting layer 105 has a quantum well structure in which quantum wells are disposed between barriers. Light may be generated as electrons and holes provided from the first and second semiconductor layers 104 and 106 are recombined in the quantum well in the light emitting layer 105. The wavelength of light generated from the light emitting layer 105 may be determined according to the energy band gap of the material forming the quantum well in the light emitting layer 105. The light emitting layer 105 may have one quantum well, but embodiments are not limited thereto, and the light emitting layer 105 may have a multi-quantum well (MQW) in which a plurality of quantum wells and a plurality of barriers are alternately arranged. The thickness of the light emitting layer 105 or the number of quantum wells in the light emitting layer 105 may be appropriately selected in consideration of the driving voltage and luminous efficiency of the light emitting device. For example, the thickness of the light emitting layer 105 may be selected to be equal to or less than twice the diameter of the light emitting layer 105.

The first semiconductor layer 104 disposed between the light emitting layer 105 and the single crystal layer 101*b* may be selected such that the lattice constant difference between the first semiconductor layer 104 and the single crystal layer 101*b* is less than the lattice constant difference between the quantum well of the light emitting layer 105 and the single crystal layer 101*b*. For example, the first semiconductor layer 104 may have a lattice constant between the lattice constant of the single crystal layer 101*b* and the lattice constant of the quantum well of the light emitting layer 105. For example, the first semiconductor layer 104 may include n-$In_xGa_{1-x}$N (0<x<0.2), and the quantum well of the light emitting layer 105 may include $In_yGa_{1-y}$N (0.25<=y<1). For example, the first semiconductor layer 104 may include, for example, n-$In_{0.2}Ga_{0.8}$N, and the quantum well of the light emitting layer 105 may include, for example, $In_{0.35}Ga_{0.65}$N. Then, the lattice mismatch is alleviated, so that the crystal quality of the light emitting layer 105 may be further improved.

The first and second semiconductor layers 104 and 106 and the light emitting layer 105 may include various other III-V compound semiconductor materials in addition to indium gallium nitride (InGaN). For example, the first and second semiconductor layers 104, 106 and the light emitting layer 105 may include materials such as aluminum gallium nitride (AlGaN), aluminum indium gallium nitride (AlInGaN), gallium arsenide (GaAs), GaN, indium phosphide (InP), and the like, and the emission wavelength and/or lattice constant of the first and second semiconductor layers 104, 106 and the light emitting layer 105 may be adjusted according to the composition ratio of the materials.

Figure 10:
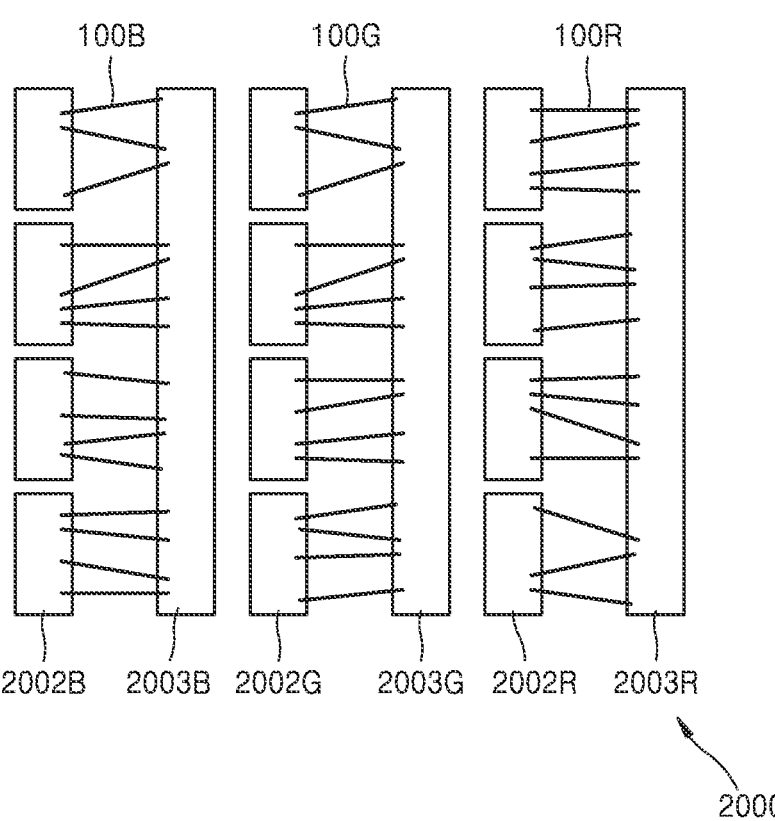
FIG. 10 is a conceptual diagram schematically showing the configuration of a display device according to an example embodiment using a nanorod light emitting device.

After forming the electrode 107, as shown in FIG. 10, a hard mask 120 having a plurality of openings arranged at regular intervals on the electrode 107 is formed. For example, after the material of the hard mask 120 is entirely formed on an upper surface of the electrode 107, the hard mask 120 having a plurality of openings arranged at regular intervals may be formed by patterning the material of the hard mask 120 in a lithographic method. The hard mask 120 may be formed of, for example, a single layer of silicon oxide ($SiO_2$) or a double layer of $SiO_2$/Al. The hard mask 120 may have a plurality of two-dimensionally arranged openings when viewed from the top.

Figure 1D:
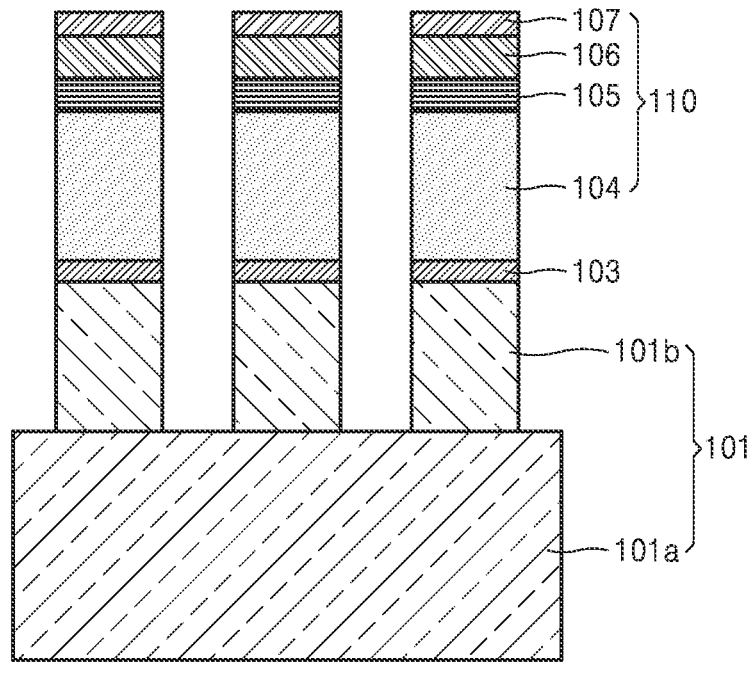

Thereafter, referring to FIG. 1D, areas not covered with the hard mask 120 may be removed by etching using a dry etching method. For example, the electrode 107, the second semiconductor layer 106, the light emitting layer 105, the first semiconductor layer 104, the two-dimensional material layer 103, and the single crystal layer 101b under the opening of the hard mask 120 may be sequentially dry-etched and removed. FIG. 1D illustrates that etching is performed up to the single crystal layer 101b and the etching is stopped at the support layer 101a, however, embodiments are not limited thereto. For example, etching may be performed up to the first semiconductor layer 104 and etching is stopped in the two-dimensional material layer 103, or etching may be performed up to the two-dimensional material layer 103 and the etching may be stopped in the single crystal layer 101b. Then, the electrode 107, the second semiconductor layer 106, the light emitting layer 105, and the first semiconductor layer 104 may be patterned in the form of a plurality of nanorods. Accordingly, a plurality of light emitting nanorods 110 each including the first semiconductor layer 104, the light emitting layer 105, the second semiconductor layer 106, and the electrode 107 may be formed at once.

Then, for example, through a wet treatment with a potassium hydroxide (KOH) solution or a tetramethyl ammonium hydroxide (TMAH) solution, it is possible to make the diameters of the plurality of light emitting nanorods 110 uniform along the height direction. In this process, the hard mask 120 may also be removed.

Figure 1E:
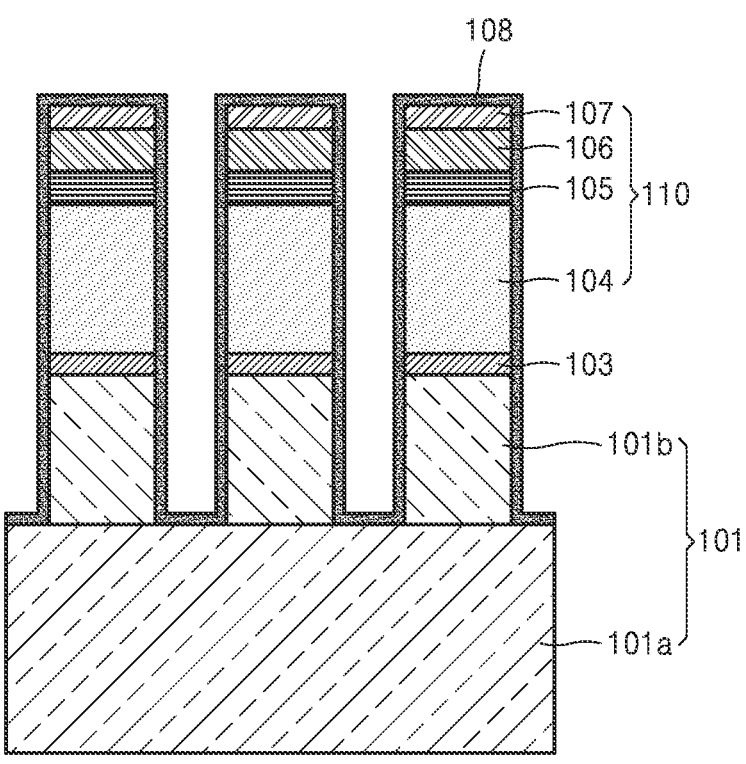

Referring to FIG. 1E, a passivation film 108 having a uniform thickness may be formed on the surface of the light emitting nanorod 110. The passivation film 108 may serve to protect the light emitting nanorod 110 from external physical and chemical impact and also to insulate the light emitting nanorod 110 to prevent leakage of current. For example, the passivation film 108 may simply be made of an insulator material.

According to another example embodiment, the passivation film 108 may include an insulating crystalline material having the same crystal structure as that of the light emitting layer 105. In particular, the passivation film 108 may have a lattice matching epitaxy relationship or a domain matching epitaxy relationship with the light emitting layer 105. The lattice matching epitaxial relationship means a relationship in which the lattice constant of the passivation film 108 is substantially equal to the lattice constant of the light emitting layer 105. In addition, the domain matching epitaxy relationship means a relationship in which the lattice constant of the passivation film 108 is approximately equal to an integer multiple of the lattice constant of the light emitting layer 105, or the lattice constant of the light emitting layer 105 is almost equal to an integer multiple of the lattice constant of the passivation film 108. In this case, because atoms located on the outer surface of the light emitting layer 105 may mostly combine with the atoms of the passivation film 108, dangling bonds on the outer surface of the light emitting layer 105 are reduced, and thus surface defects are also reduced. Accordingly, a current may flow relatively uniformly in the entire area of the light emitting layer 105 and light emission may occur relatively uniformly in the entire area of the light emitting layer 105. Accordingly, the luminous efficiency of the light emitting layer 105 may be increased. As such, the passivation film 108 having an epitaxial relationship with the light emitting layer 105 may include at least one material of zirconium oxide (ZrO), strontium oxide (SrO), magnesium oxide (MgO), barium oxide (BaO), cerium oxide ($CeO_2$), gadolinium oxide ($Gd_2O_3$), oxycalcium (CaO), hafnium oxide ($HfO_2$), titanium oxide ($TiO_2$), aluminum oxide ($AlO_x$), barium nitride (BaN), silicon nitride (SiN), titanium nitride (TiN), cerium nitride (CeN), aluminum nitride (AlN), zinc selenide (ZnSe), zinc sulfide (ZnS), aluminum gallium nitride (AlGaN), and $Al_xGa_{1-x}As$ (x≥0.9), for example.

Figure 1F:
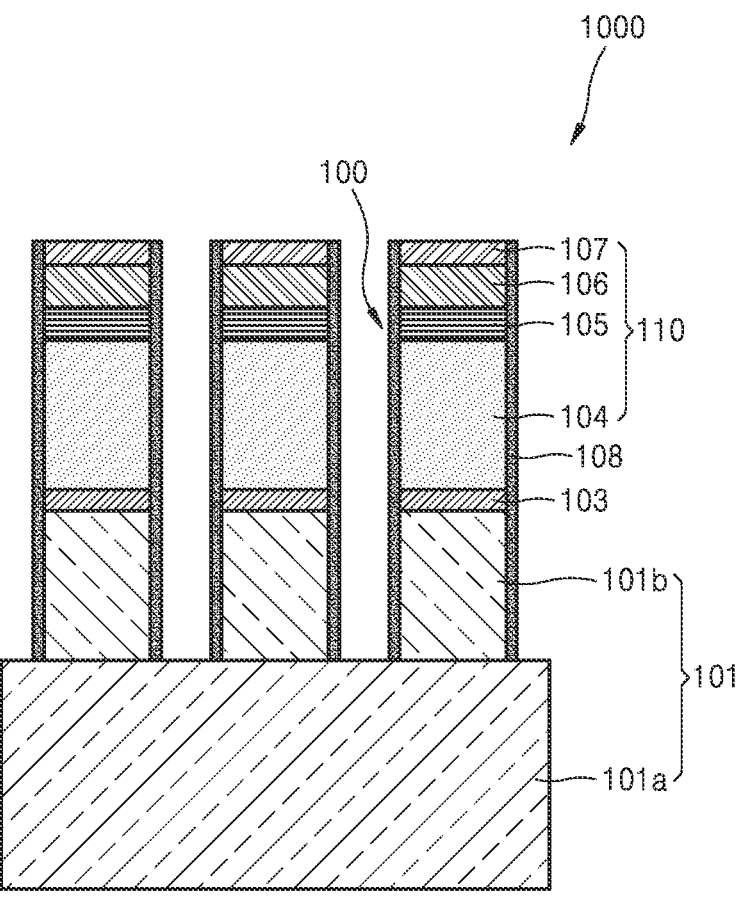

Finally, referring to FIG. 1F, the passivation film 108 present on the upper surface of the light emitting nanorod 110 may be removed. The remaining passivation film 108 is provided adjacent to and surrounds the sidewall of the light emitting nanorod 110. The passivation film 108 may surround the entire sidewall of the electrode 107 or may surround a part of the sidewall of the electrode 107. In addition, when etching is performed up to the two-dimensional material layer 103, the passivation film 108 may extend to the sidewall of the patterned two-dimensional material layer 103, and when etching is performed up to the single crystal layer 101b, the passivation film 108 may extend to the sidewall of the patterned single crystal layer 101b.

In the above-described manner, a plurality of nanorod light emitting devices 100 having a nanorod shape and an epitaxy structure 1000 including a plurality of nanorod light emitting devices 100 may be formed. The epitaxy structure 1000 may include a substrate 101 having an upper surface having a single crystal structure, a two-dimensional material layer 103 disposed on the upper surface of the substrate 101, and a plurality of nanorod light emitting devices 100 disposed on the upper surface of the two-dimensional material layer 103. The plurality of nanorod light emitting devices 100 may be arranged to extend in a direction perpendicular to the upper surface of the substrate 101. In addition, each nanorod light emitting device 100 may include a light emitting nanorod 110 and a passivation film 108 surrounding a sidewall of the light emitting nanorod 110. A plurality of nanorod light emitting devices 100 may be two-dimensionally arranged on the substrate 101.

In addition, the single crystal layer 101b and the two-dimensional material layer 103 of the substrate 101 may be patterned to have the same cross-sectional shape as the plurality of light emitting nanorods 110. Accordingly, the single crystal layer 101b of the substrate 101 and the two-dimensional material layer 103 may have the form of a plurality of nanorods respectively extending from the plurality of corresponding light emitting nanorods 110.

The plurality of nanorod light emitting devices 100 may be more easily separated from the two-dimensional material layer 103. Accordingly, a chemical process for separating the plurality of nanorod light emitting devices 100 from the epitaxy structure 1000 is not required. In addition, the cut surface of the separated portion of the nanorod light emitting device 100 may have a relatively smooth surface. Although the nanorod light emitting device 100 individually separated from the epitaxy structure 1000 may be distributed/traded, the epitaxy structure 1000 itself may be distributed/traded. For example, a manufacturer of a display device may purchase the epitaxy structure 1000 on which a plurality of nanorod light emitting devices 100 are formed, and may manufacture a display device by separating the nanorod light emitting devices 100 from the epitaxy structure 1000.

Figure 2:
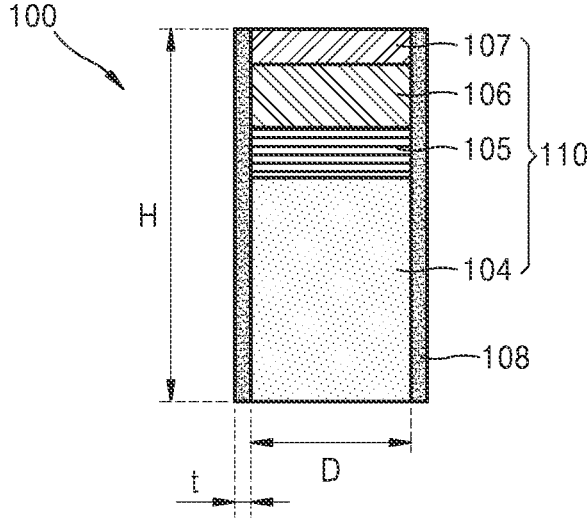
FIG. 2 is a cross-sectional view showing a schematic configuration of a nanorod light emitting device according to an example embodiment.

FIG. 2 is a cross-sectional view showing a schematic configuration of a nanorod light emitting device according to an example embodiment. In particular, FIG. 2 exemplarily shows the configuration of the nanorod light emitting device 100 separated from the epitaxy structure 1000 shown in FIG. 1F. Referring to FIG. 2, the nanorod light emitting device 100 may include a light emitting nanorod 110 and a passivation film 108 provided adjacent to and surrounding sidewalls of the light emitting nanorod 110. The light emitting nanorod 110 may include a first semiconductor layer 104, a light emitting layer 105 disposed on the first semiconductor layer 104, and a second semiconductor layer 106 disposed on the light emitting layer 105. In addition, the light emitting nanorod 110 may further include an electrode 107 disposed on the second semiconductor layer 106. The light emitting nanorod 110 may further include a contact layer disposed between the second semiconductor layer 106 and the electrode 107.

The light emitting nanorod 110 may have a very small size of a nano-scale or a micro-scale. For example, the light emitting nanorod 110 may have a diameter D in the range of about 0.05 μm to about 1 μm. The light emitting nanorod 110 may have a substantially uniform diameter along the height direction. For example, diameters of the first semiconductor layer 104, the light emitting layer 105, the second semiconductor layer 106, and the electrode 107 may be substantially the same. When the length between the lower surface of the first semiconductor layer 104 and the upper surface of the electrode 107 is the height H of the light emitting nanorod 110, the height H of the light emitting nanorod 110 may be approximately in the range of about 1 μm to about 20 μm. In addition, the light emitting nanorod 110 may have a relatively large aspect ratio of, for example, 5 or more. For example, the light emitting nanorod 110 may have a diameter D of about 500 nm to about 600 nm and a height H of about 4 μm to about 5 μm.

Because the size of the nanorod light emitting device 100 is very small, deformation due to stress may have a significant effect on the performance of the nanorod light emitting device 100. According to an example embodiment, the nanorod light emitting device 100 having a high-quality single crystal structure may be formed by using the remote epitaxy technique using the two-dimensional material layer 103. Accordingly, because the nanorod light emitting device 100 has a high-quality single crystal structure, there are relatively few defects, so that the luminous efficiency of the nanorod light emitting device 100 may be improved. In addition, by using a relatively inexpensive substrate material such as silicon, the epitaxy structure 1000 including a plurality of nanorod light emitting devices 100 having a high-quality single crystal structure may be manufactured at a relatively low cost.

Figure 3:
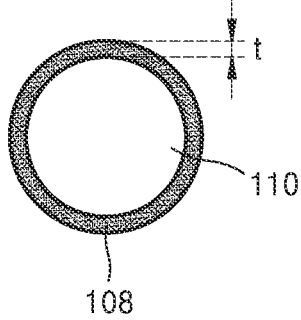
FIG. 3 is a plan view of the nanorod light emitting device shown in FIG. 2.

FIG. 3 is a plan view of the nanorod light emitting device 100 shown in FIG. 2. Referring to FIG. 3, the passivation film 108 may be placed to completely surround the sidewall of the light emitting nanorod 110. Therefore, the passivation film 108 may have a ring shape in a plan view, and may have a cylindrical shape as a whole. Although the light emitting nanorod 110 is illustratively shown as having a circular shape in FIG. 3, embodiments are not limited thereto. The thickness t of the passivation film 108 according to the diameter direction of the nanorod light emitting device 100, that is, the distance between the inner sidewall and the outer sidewall of the passivation film 108, may be in the range of about 5 nm to about 70 nm.

Figure 4:
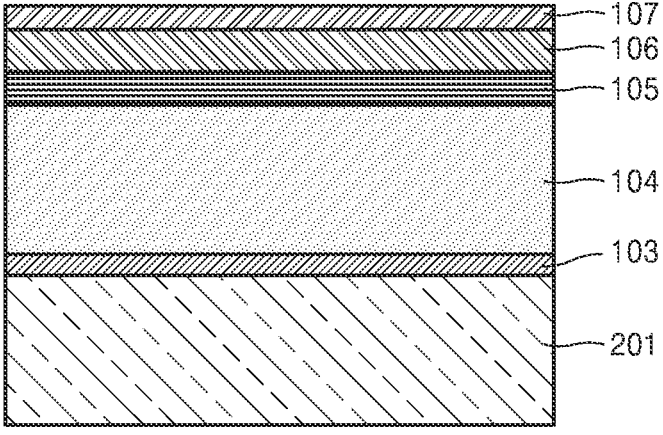
FIGS. 4 and 5 are cross-sectional views exemplarily showing a method of manufacturing an epitaxy structure including a plurality of nanorod light emitting devices according to another example embodiment.
Figure 5:
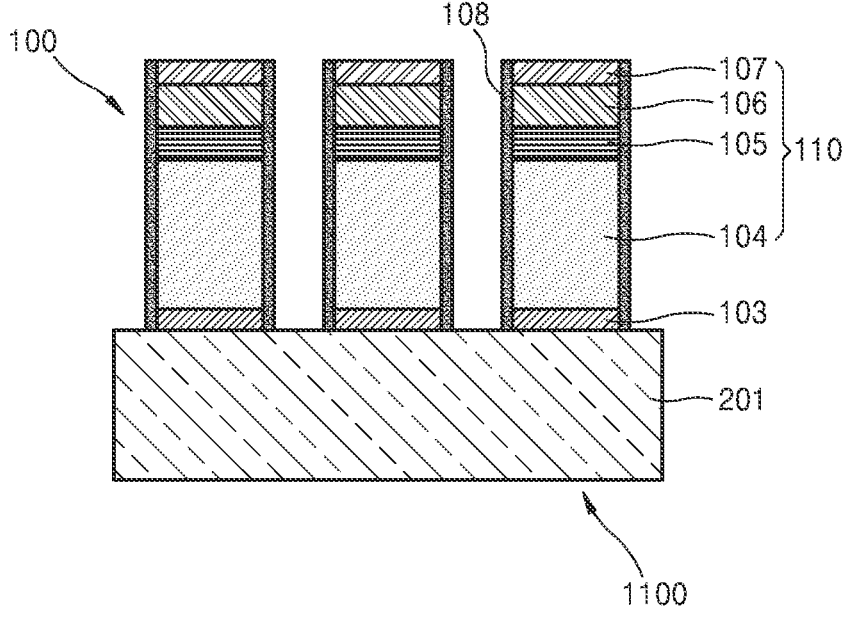

FIGS. 4 and 5 are cross-sectional views exemplarily illustrating a method of manufacturing an epitaxy structure including a plurality of nanorod light emitting devices according to an example embodiment.

Referring to FIG. 4, the substrate 201 may include one single layer having an upper surface having a single crystal structure. For example, the substrate 201 may include a single crystal of silicon carbide (SiC). In particular, the substrate 201 may include a single crystal of 4H—SiC, 6H—SiC, or 3C—SiC. In this case, the substrate 201 may be a single crystal having a polarity or an ionic bond characteristic.

In the example embodiment shown in FIG. 1A, it has been described that the two-dimensional material layer 103 is transferred onto the single crystal layer 101b, but the two-dimensional material layer 103 may be directly grown on the upper surface of the substrate 201 including silicon carbide without transfer. After growing the two-dimensional material layer 103 on the substrate 201, a first semiconductor layer 104, a light emitting layer 105, a second semiconductor layer 106, and an electrode 107 may be sequentially grown on the upper surface of the two-dimensional material layer 103.

Thereafter, an epitaxy structure including a plurality of nanorod light emitting devices 100 may be formed by performing the processes described with reference to FIGS. 1D to 1F. Referring to FIG. 5, the epitaxy structure 1100 may include a substrate 201 and a plurality of nanorod light emitting devices 100 disposed on the upper surface of the substrate 201. The two-dimensional material layer 103 is disposed between the upper surface of the substrate 201 and each nanorod light emitting device 100. The two-dimensional material layer 103 is illustrated in FIG. 5 as being patterned to have the same cross-sectional shape as the plurality of light emitting nanorods 110, but only the first semiconductor layer 104 may be patterned and the two-dimensional material layer 103 may not be patterned.

Figure 6:
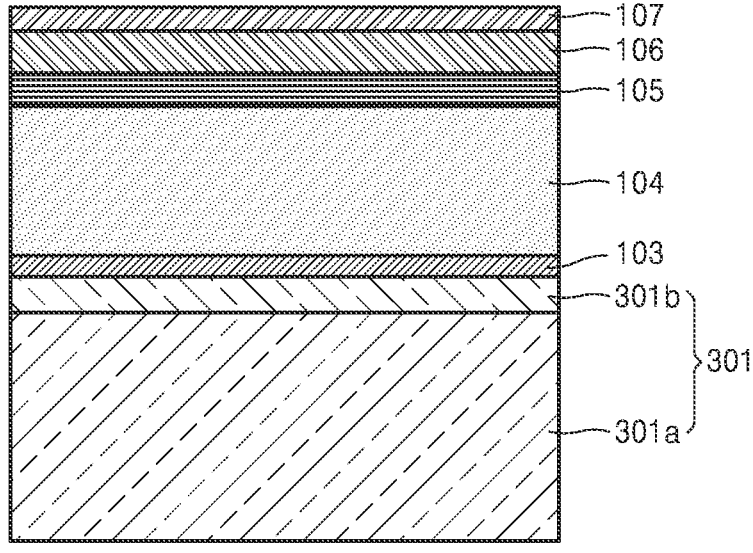
FIGS. 6 and 7 are example cross-sectional views illustrating a method of manufacturing an epitaxy structure including a plurality of nanorod light emitting devices according to another example embodiment.
Figure 7:
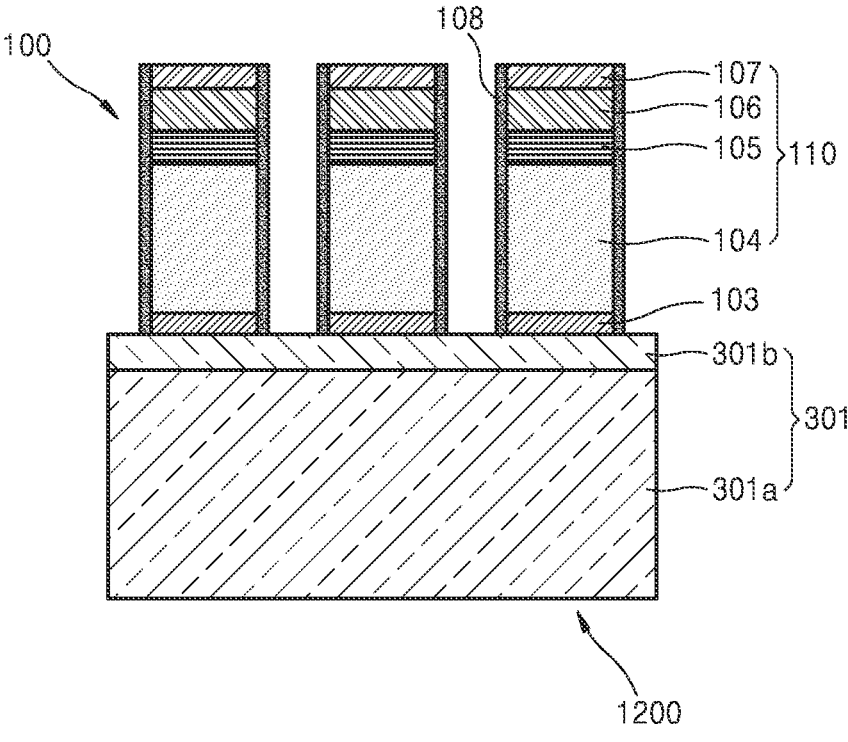

According to another example embodiment, it is also possible to form the nanorod light emitting device 100 including a single crystal material on an amorphous material such as glass. FIGS. 6 and 7 are example cross-sectional views illustrating a method of manufacturing an epitaxy structure including a plurality of nanorod light emitting devices according to another example embodiment.

Referring to FIG. 6, the substrate 301 may include a support layer 301a including an amorphous material such as glass or fused silica, and a single crystal layer 301b disposed on an upper surface of the support layer 301a. On the support layer 301a including the amorphous material, the single crystal layer 301b may be grown using, for example, an ion beam assisted deposition (IBAD) method. For example, the single crystal layer 301b may include CeO₂, scandium(III) oxide (Sc₂O₃), MgO, BaO, bromine nitride (BrN), and the like oriented in a (111) direction, a (001) direction, or a (100) direction. The two-dimensional material layer 103 may be transferred or directly grown on an upper surface of the single crystal layer 301b. In addition, the first semiconductor layer 104, the light emitting layer 105, the second semiconductor layer 106, and the electrode 107 may be sequentially grown on the upper surface of the two-dimensional material layer 103. The first semiconductor layer 104, the light emitting layer 105, and the second semiconductor layer 106 may include various III-V compound semiconductor materials in addition to InGaN, for example, AlGaN, AlInGaN, GaAs, GaN, InP, and the like depending on the material and orientation of the single crystal layer 301b.

Thereafter, an epitaxy structure including a plurality of nanorod light emitting devices 100 may be formed by performing the processes described with reference to FIGS. 1D to 1F. Referring to FIG. 7, the epitaxy structure 1200 may include a substrate 301 and a plurality of nanorod light emitting devices 100 disposed on the upper surface of the substrate 301. The two-dimensional material layer 103 is disposed between the upper surface of the substrate 301, that is, the upper surface of the single crystal layer 301b, and each nanorod light emitting device 100. FIG. 7 shows that only the two-dimensional material layer 103 is patterned to have the same cross-sectional shape as the plurality of light emitting nanorods 110, but the single crystal layer 301b may also be patterned to have the same cross-sectional shape as the plurality of light emitting nanorods 110.

Figure 8:
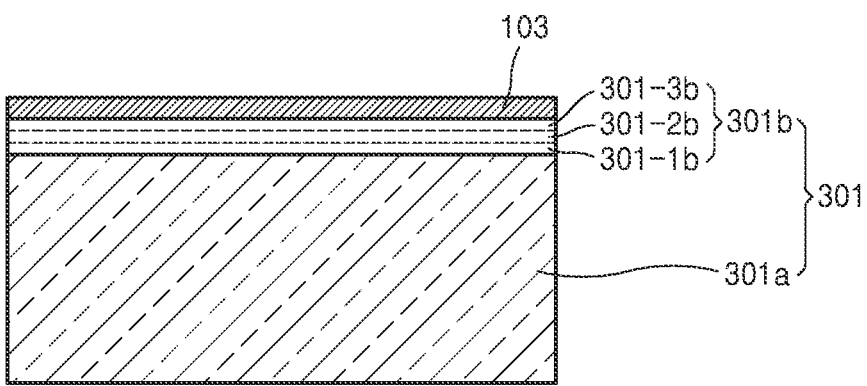
FIG. 8 is a cross-sectional view schematically illustrating a structure of a substrate according to another example embodiment.

Although the single crystal layer 301b is illustrated as including only one single layer in FIG. 6, the single crystal layer 301b may have a multilayer structure having two or more sub-layers as needed. FIG. 8 is a cross-sectional view schematically illustrating a structure of a substrate according to another example embodiment. Referring to FIG. 8, the single crystal layer 301b may include, for example, a plurality of sub-layers 301-1b, 301-2b, and 301-3b each having a thin thickness of about 0.5 nm to about 100 nm. Each of the plurality of sub-layers 301-1b, 301-2b, and 301-3b may include $CeO_2$, $Sc_2O_3$, MgO, BaO, or BrN oriented in a (111) direction, a (001) direction, or a (100) direction. Although the single crystal layer 301b is illustrated as including three sub-layers in FIG. 8, the example embodiment is not limited thereto. The single crystal layer 301b may include two sub-layers or four or more sub-layers.

Figure 9:
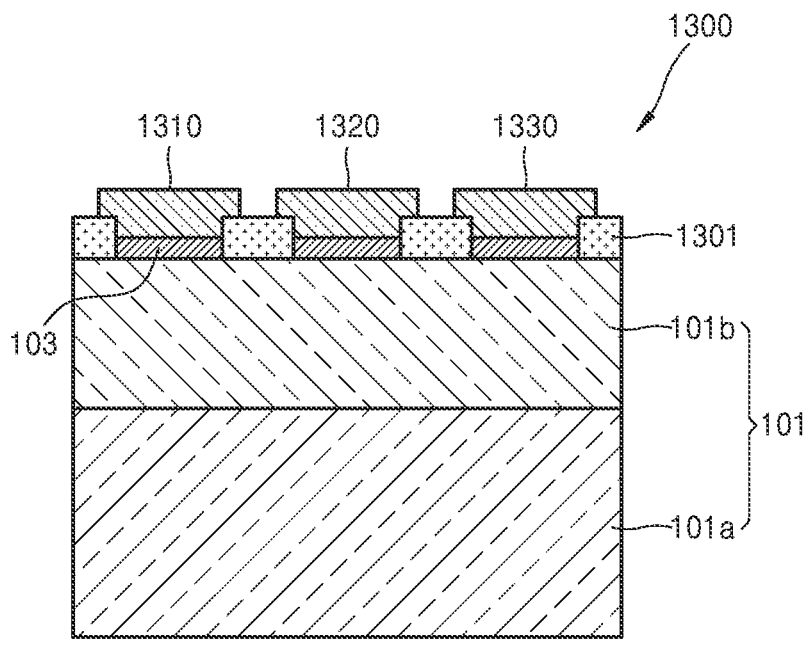
FIG. 9 is a cross-sectional view illustrating an epitaxy structure including a plurality of semiconductor devices according to another example embodiment.

An example of forming the nanorod light emitting device 100 on a substrate using remote epitaxy technology has been described, but in addition to the nanorod light emitting device 100, various other semiconductor devices may be formed. FIG. 9 is a cross-sectional view illustrating an epitaxy structure including a plurality of semiconductor devices according to another embodiment.

Referring to FIG. 9, the epitaxy structure 1300 may include a substrate 101, an insulating layer 1301 disposed on an upper surface of the substrate 101, a plurality of two-dimensional material layers 103 disposed on the upper surface of the substrate 101 and electrically isolated from each other by an insulating layer 1301, and a plurality of semiconductor devices 1310, 1320, and 1330 respectively disposed on the plurality of two-dimensional material layers 103. The plurality of semiconductor devices 1310, 1320, and 1330 may include different semiconductor materials and may be configured to perform different functions. For example, the plurality of semiconductor devices 1310, 1320, and 1330 may include at least one semiconductor material selected from among InGaN, AlGaN, AlInGaN, GaAs, GaN, InP, Si, and Ge. In addition, the plurality of semiconductor devices 1310, 1320, and 1330 may include any one of a light source, a photodetector, an optical modulator, and an optical amplifier.

The epitaxy structure 1300 may further include various optical elements disposed on the upper surface of the substrate 101 in addition to the plurality of semiconductor devices 1310, 1320, and 1330. For example, the optical element may include an optical waveguide, an optical coupler, a beam splitter, and the like. Such an epitaxy structure 1300 may be used to implement, for example, a monolithic photonic integrated circuit, and may be applied to a laser imaging detection and ranging (LiDAR) sensor for autonomous driving, an optical connection device for a data center, and the like. In addition, although the epitaxy structure 1300 is illustrated in FIG. 9 as including the substrate 101 shown in FIG. 1, the epitaxy structure 1300 may include the substrate 201 illustrated in FIG. 4 or the substrate 301 illustrated in FIG. 6.

The nanorod light emitting device 100 described above according to an example embodiment is capable of various applications. In particular, the nanorod light emitting device 100 may be used as a light emitting element of pixels of a next-generation display device. For example, FIG. 10 is a conceptual diagram schematically showing a configuration of a display device according to an embodiment using a nanorod light emitting device.

Referring to FIG. 10, the display apparatus 2000 may include a plurality of first pixel electrodes 2002B, a first common electrode 2003B corresponding to the plurality of first pixel electrodes 2002B, a plurality of second pixel electrodes 2002G, a second common electrode 2003G corresponding to the plurality of second pixel electrodes 2002G, a plurality of third pixel electrodes 2002R, a third common electrode 2003R corresponding to the plurality of third pixel electrodes 2002R, a plurality of first nanorod light emitting devices 100B connected between each of the first pixel electrodes 2002B and the first common electrode 2003B, a plurality of second nanorod light emitting devices 100G connected between each second pixel electrode 2002G and a second common electrode 2003G, and a plurality of third nanorod light emitting devices 100R connected between each third pixel electrode 2002R and the third common electrode 2003R.

For example, the first nanorod light emitting device 100B may be configured to emit blue light, the second nanorod light emitting device 100G may be configured to emit green light, and the third nanorod light emitting device 100R may be configured to emit red light. In addition, one first pixel electrode 2002B may form one blue sub-pixel together with the first common electrode 2003B, one second pixel electrode 2002G may form one green sub-pixel together with the second common electrode 2003G, and one third pixel electrode 2002R may form one red sub-pixel together with the third common electrode 2003R.

In addition, the above-described nanorod light emitting device 100 may be applied without limitation to display devices of various sizes and various uses. For example, FIGS. 11 to 16 exemplarily show various devices including a display device to which nanorod light emitting devices 100 according to an embodiment are applied.

Figure 11:
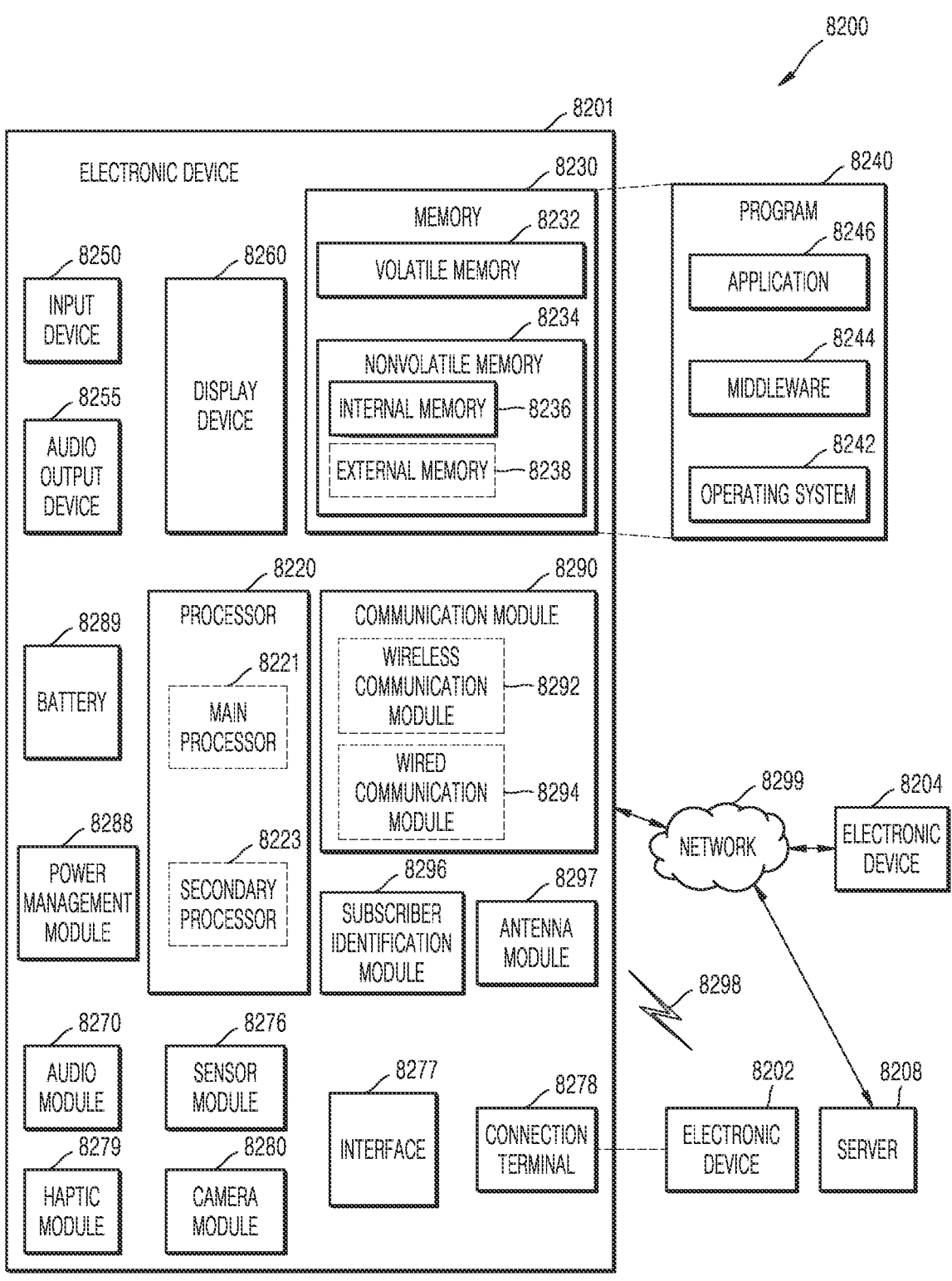
FIG. 11 is a schematic block diagram of an electronic device according to an example embodiment.

First, FIG. 11 is a schematic block diagram of an electronic device according to an example embodiment. Referring to FIG. 11, an electronic device 8200 may be provided in a network environment 8201. In the network environment 8200, the electronic device 8201 may communicate with another electronic device 8202 through a first network 8298 (such as a short-range wireless communication network, and the like), or communicate with another electronic device 8204 and/or a server 8208 through a second network 8299 (such as a remote wireless communication network). The electronic device 8201 may communicate with the electronic device 8204 through the server 8208. The electronic device 8201 may include a processor 8220, a memory 8230, an input device 8250, an audio output device 8255, a display device 8260, an audio module 8270, a sensor module 8276, and an interface 8277, a haptic module 8279, a camera module 8280, a power management module 8288, a battery 8289, a communication module 8290, a subscriber identification module 8296, and/or an antenna module 8297. In the electronic device 8201, some of these components may be omitted or other components may be added. Some of these components may be implemented as one integrated circuit. For example, the sensor module 8276 (fingerprint sensor, iris sensor, illuminance sensor, etc.) may be implemented by being embedded in the display device 8260 (display, etc.).

The processor 8220 may execute software (the program 8240, etc.) to control one or a plurality of other components (such as hardware, software components, etc.) of the electronic device 8201 connected to the processor 8220, and perform various data processing or operations. As part of data processing or operation, the processor 8220 may load commands and/or data received from other components (the sensor module 8276, the communication module 8290, etc.) into the volatile memory 8232, process commands and/or data stored in the volatile memory 8232, and store result data in the nonvolatile memory 8234. The nonvolatile memory 8234 may include an internal memory 8236 mounted in the electronic device 8201 and a removable external memory 8238. The processor 8220 may include a main processor 8221 (such as a central processing unit, an application processor, etc.) and a secondary processor 8223 (such as a graphics processing unit, an image signal processor, a sensor hub processor, a communication processor, etc.) that may be operated independently or together. The secondary processor 8223 may use less power than the main processor 8221 and may perform specialized functions.

The secondary processor 8223 may control functions and/or states related to some of the components of the electronic device 8202 (such as the display device 8260, the sensor module 8276, the communication module 8290, etc.) instead of the main processor 8221 while the main processor 8221 is in an inactive state (sleep state), or with the main processor 8221 while the main processor 8221 is in an active state (application execution state). The secondary processor 8223 (such as an image signal processor, a communication processor, etc.) may be implemented as part of other functionally related components (such as the camera module 8280, the communication module 8290, etc.).

The memory 8230 may store various data required by components of the electronic device 8201 (such as the processor 8220, the sensor module 8276, etc.). The data may include, for example, software (such as the program 8240, etc.) and input data and/or output data for commands related thereto. The memory 8230 may include a volatile memory 8232 and/or a nonvolatile memory 8234.

The program 8240 may be stored as software in the memory 8230 and may include an operating system 8242, a middleware 8244, and/or an application 8246.

The input device 8250 may receive commands and/or data to be used for components (such as the processor 8220, etc.) of the electronic device 8201 from outside (a user) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as a part of the speaker or may be implemented as an independent separate device.

The display device 8260 may visually provide information to the outside of the electronic device 8201. The display device 8260 may include a display, a hologram device, or a projector and a control circuit for controlling the device. The display device 8260 may include the above-described driving circuit, micro semiconductor light emitting device, side reflection structure, bottom reflection structure, and the like. The display device 8260 may include a touch circuit set to sense a touch, and/or a sensor circuit (such as a pressure sensor) set to measure the strength of a force generated by the touch.

The audio module 8270 may convert sound into an electrical signal, or conversely, may convert an electrical signal into sound. The audio module 8270 may acquire sound through the input device 8250 or output sound through speakers and/or headphones of the audio output device 8255, and/or other electronic devices (such as the electronic device 8202) directly or wirelessly connected to the electronic device 8201.

The sensor module 8276 may detect an operating state (such as power, temperature, and the like) of the electronic device 8201 or an external environmental state (such as a user state, and the like), and generate an electrical signal and/or data value corresponding to the detected state. The sensor module 8276 may include a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more specified protocols that may be used for the electronic device 8201 to connect directly or wirelessly with another electronic device (such as the electronic device 8102). The interface 8277 may include a High Definition Multimedia Interface (HDMI), a Universal Serial Bus (USB) interface, an SD card interface, and/or an audio interface.

The connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (such as vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and a video. The camera module 8280 may include a lens assembly including one or more lenses, image sensors, image signal processors, and/or flashes. The lens assembly included in the camera module 8280 may collect light emitted from a subject that is a target of image capturing.

The power management module 8288 may manage power supplied to the electronic device 8201. The power management module 8288 may be implemented as a part of a Power Management Integrated Circuit (PMIC).

The battery 8289 may supply power to components of the electronic device 8201. The battery 8289 may include a non-rechargeable primary cell, a rechargeable secondary cell, and/or a fuel cell.

The communication module 8290 may support establishing a direct (wired) communication channel and/or a wireless communication channel, and performing communication through the established communication channel between the electronic device 8201 and other electronic devices (such as the electronic device 8202, the electronic device 8204, the server 8208, and the like). The communication module 8290 may include one or more communication processors that operate independently of the processor 8220 (such as an application processor) and support direct communication and/or wireless communication. The communication module 8290 may include a wireless communication module 8292 (such as a cellular communication module, a short-range wireless communication module, a Global Navigation Satellite System (GNSS) communication module, and the like) and/or a wired communication module 8294 (such as a local area network (LAN) communication module, a power line communication module, and the like). Among these communication modules, a corresponding communication module may communicate with other electronic devices through a first network 8298 (a short-range communication network such as Bluetooth, WiFi Direct, or Infrared Data Association (IrDA)) or a second network 8299 (a cellular network, the Internet, or a telecommunication network such as a computer network (such as LAN, WAN, and the like)). These various types of communication modules may be integrated into one component (such as a single chip, and the like), or may be implemented as a plurality of separate components (a plurality of chips). The wireless communication module 8292 may check and authenticate the electronic device 8201 in a communication network such as the first network 8298 and/or the second network 8299 using the subscriber information (such as international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator made of a conductive pattern formed on a substrate (such as PCB, etc.). The antenna module 8297 may include one or a plurality of antennas. If multiple antennas are included, an antenna suitable for a communication method used in a communication network such as the first network 8298 and/or the second network 8299 may be selected from the plurality of antennas by the communication module 8290. Signals and/or power may be transmitted or received between the communication module 8290 and another electronic device through the selected antenna. In addition to the antenna, other components (such as RFIC) may be included as part of the antenna module 8297.

Some of the components are connected to each other and may exchange signals (such as commands, data, and the like) through communication method between peripheral devices (such as bus, General Purpose Input and Output (GPIO), Serial Peripheral Interface (SPI), Mobile Industry Processor Interface (MIPI), and the like).

The command or data may be transmitted or received between the electronic device 8201 and the external electronic device 8204 through the server 8208 connected to the second network 8299. The other electronic devices 8202 and 8204 may be the same or different types of devices as or from the electronic device 8201. All or some of the operations executed by the electronic device 8201 may be executed by one or more of the other electronic devices 8202, 8204, and 8208. For example, when the electronic device 8201 needs to perform a certain function or service, instead of executing the function or service itself, the electronic device 8201 may request one or more other electronic devices to perform the function or part or all of the service. One or more other electronic devices that receive the request may execute an additional function or service related to the request, and transmit a result of the execution to the electronic device 8201. For this, cloud computing, distributed computing, and/or client-server computing technology may be used.

Figure 12:
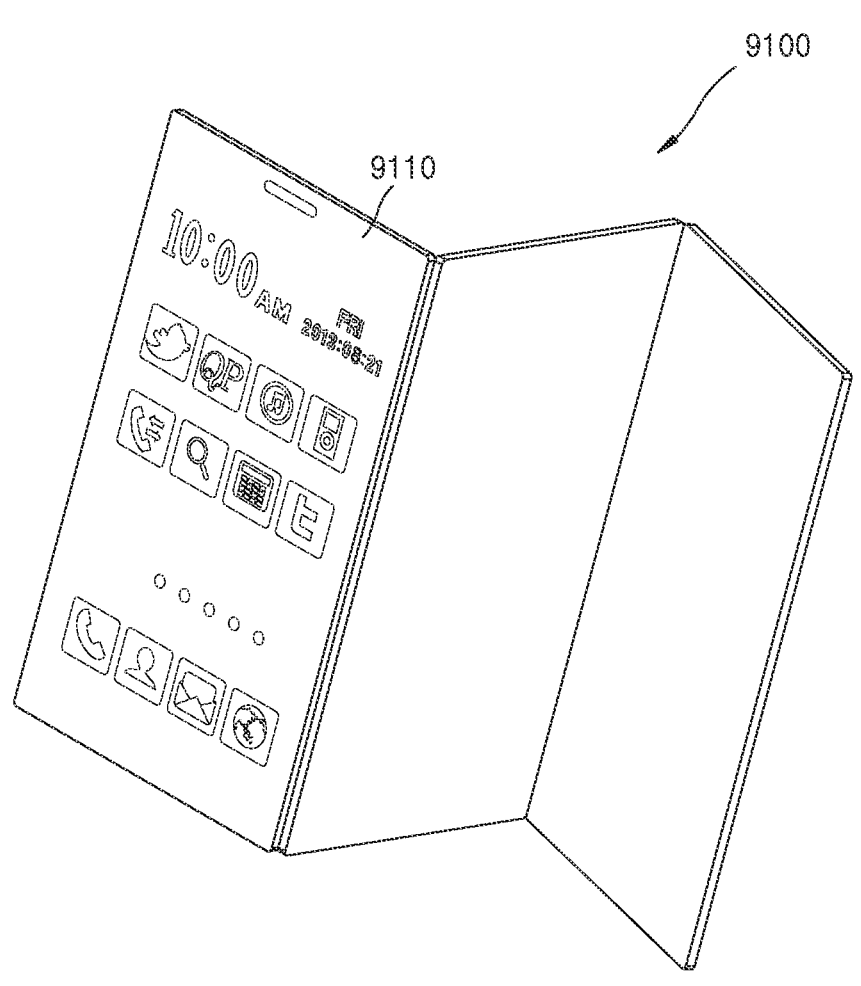
FIG. 12 illustrates an example in which a display device according to example embodiments is applied to a mobile device.

FIG. 12 illustrates an example in which a display device according to example embodiments is applied to a mobile device. The mobile device 9100 may include a display device 9110, and the display device 9110 may include the above-described driving circuit, micro semiconductor light emitting device, side reflection structure, bottom reflection structure, and the like. The display device 9110 may have a foldable structure, for example, a multi-foldable structure.

Figure 13:
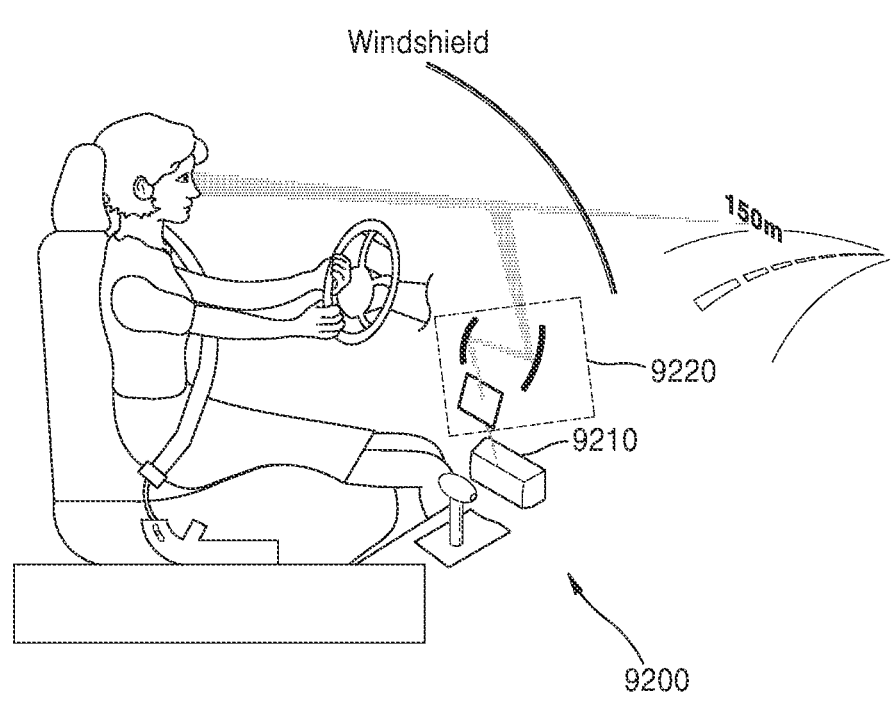
FIG. 13 illustrates an example in which a display device according to example embodiments is applied to a vehicle display device.

FIG. 13 illustrates an example in which the display device according to the example embodiments is applied to a vehicle display device. The display device may be a vehicle head-up display device 9200, and may include a display 9210 provided in an area of the vehicle, and a light path changing member 9220 that converts an optical path so that the driver may see the image generated on the display 9210.

Figure 14:
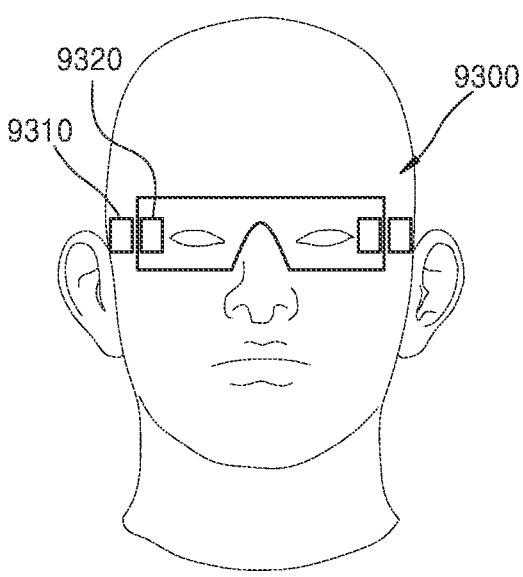
FIG. 14 illustrates an example in which a display device according to example embodiments is applied to augmented reality glasses or virtual reality glasses.

FIG. 14 illustrates an example in which a display device according to example embodiments is applied to augmented reality glasses or virtual reality glasses. The augmented reality glasses 9300 may include a projection system 9310 that forms an image, and an element 9320 that guides the image from the projection system 9310 into the user's eye. The projection system 9310 may include the above-described driving circuit, micro semiconductor light emitting device, side reflection structure, bottom reflection structure, and the like.

Figure 15:
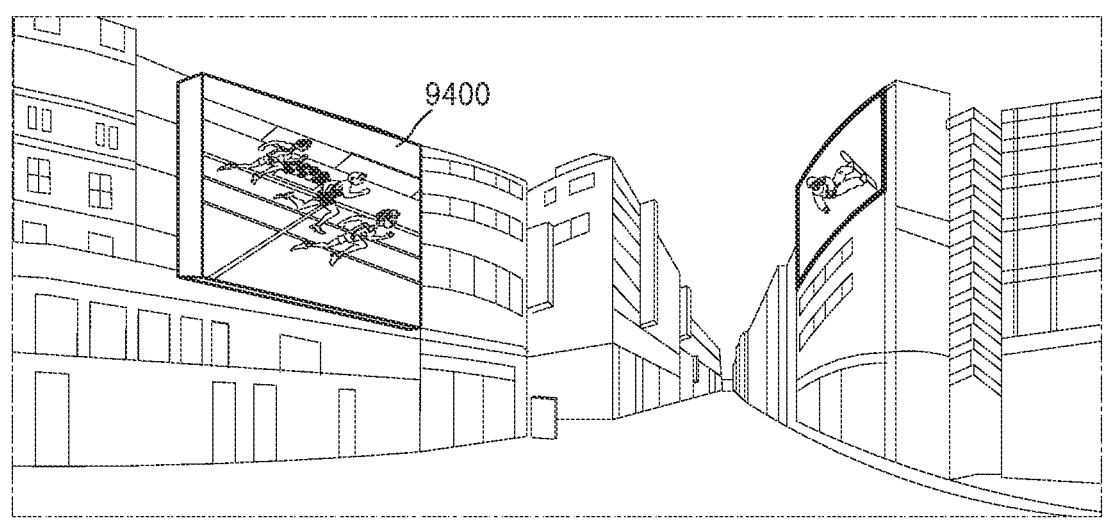
FIG. 15 shows an example in which the display device according to the example embodiments is applied to a signage.

FIG. 15 illustrates an example in which a display device according to example embodiments is applied to a signage. A signage 9400 may be used for outdoor advertisement using a digital information display, and may control advertisement contents and the like through a communication network. The signage 9400 may be implemented, for example, through the electronic device described with reference to FIG. 11.

Figure 16:
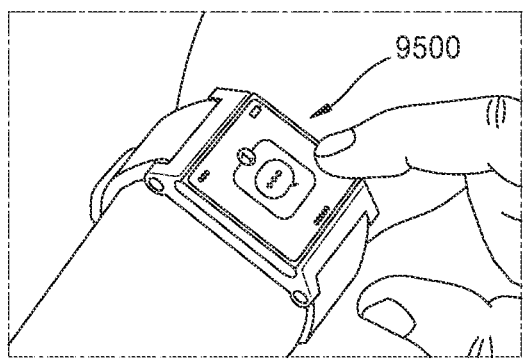
FIG. 16 illustrates an example in which a display device according to example embodiments is applied to a wearable display.

FIG. 16 illustrates an example in which a display device according to example embodiments is applied to a wearable display. The wearable display 9500 may include the above-described driving circuit, micro semiconductor light emitting device, side reflection structure, bottom reflection structure, and the like, and may be implemented through the electronic device described with reference to FIG. 11.

The display device according to the example embodiment may also be applied to various products such as a rollable TV and a stretchable display.

The above-described nano-rod light-emitting device, the epitaxial structure including a plurality of nano-rod light-emitting devices, and the method of manufacturing the epitaxial structure have been described with reference to the example embodiments shown in the drawings, but this is only exemplary, and it will be understood by those skilled in the art that various modifications and equivalent other embodiments are possible therefrom. Therefore, the disclosed example embodiments are to be considered in an illustrative rather than a restrictive sense. The scope of rights is indicated in the claims rather than the above description, and all differences within the scope of equivalents should be construed as being included in the scope of rights.

It should be understood that embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. An epitaxy structure comprising:
    a substrate comprising:
        a single support layer; and
        a plurality of single crystal layers on the single support layer and spaced apart from each other, the plurality of single crystal layers having a single crystal structure comprising at least one single crystal of lithium fluoride (LiF) and barium titanate (BaTiO₃);

a plurality of two-dimensional material layers respectively disposed on the plurality of single crystal layers; and a plurality of nanorod light emitting devices, each of the plurality of nanorod light emitting devices being disposed on an upper surface of a corresponding two-dimensional material layer of the plurality of two-dimensional material layers, each of the plurality of nanorod light emitting devices having a nanorod shape extending in a vertical direction, wherein each of the plurality of nanorod light emitting devices comprises:

a light emitting nanorod; and a passivation film disposed adjacent to a sidewall of the light emitting nanorod, the passivation film having insulation, and wherein the sidewall of the light emitting nanorod and a sidewall of each two-dimensional material layer of the plurality of two-dimensional material layers are coplanar.

2. The epitaxy structure of claim 1, wherein the single support layer comprises a crystalline material, and wherein the single crystal layer comprises a single crystal of a group III-V compound semiconductor having an ionic bond characteristic or an ionic crystal.

3. The epitaxy structure of claim 2, wherein the single support layer comprises silicon (Si) or sapphire.

4. The epitaxy structure of claim 2, wherein the single crystal layer further comprises at least one single crystal of gallium nitride (GaN).

5. The epitaxy structure of claim 1, wherein the single support layer comprises an amorphous material.

6. The epitaxy structure of claim 5, wherein the single crystal layer further comprises at least one of cerium oxide (CeO₂), scandium(III) oxide (Sc₂O₃), magnesium oxide (MgO), barium oxide (BaO), and bromine nitride (BrN) oriented in a (111) direction, a (001) direction, or a (100) direction.

7. The epitaxy structure of claim 6, wherein the single crystal layer comprises at least two sub-layers, each of the at least two sub-layers having a thickness of 0.5 nm to 100 nm.

8. The epitaxy structure of claim 5, wherein the single support layer comprises glass or fused silica.

9. The epitaxy structure of claim 1, wherein the plurality of two-dimensional material layers comprise a plurality of nanorods respectively extending from a corresponding light emitting nanorod.

10. The epitaxy structure of claim 1, wherein the single crystal layer comprises a plurality of nanorods respectively extending from a corresponding light emitting nanorod.

11. The epitaxy structure of claim 1, wherein the substrate comprises one single layer having a single crystal structure.

12. The epitaxy structure of claim 11, wherein the substrate comprises at least one single crystal from among 4H—SiC, 6H—SiC, and 3C—SiC.

13. The epitaxy structure of claim 11, wherein the plurality of two-dimensional material layers comprise a plurality of nanorods respectively extending from a corresponding light emitting nanorod.

14. The epitaxy structure of claim 1, wherein the plurality of two-dimensional material layers comprises at least one of graphene, boron nitride, and a transition metal dichalcogenide.

15. The epitaxy structure of claim 1, wherein the light emitting nanorod comprises:

a first semiconductor layer disposed on the upper surface of each two-dimensional material layer of the plurality of two-dimensional material layers, the first semiconductor layer being doped with a first conductivity type;

a light emitting layer disposed on the first semiconductor layer;

a second semiconductor layer disposed on the light emitting layer, the second semiconductor layer being doped with a second conductivity type that is electrically opposite to the first conductivity type; and an electrode disposed on the second semiconductor layer.

16. The epitaxy structure of claim 15, wherein the light emitting nanorod has a height in a range of 1 μm to 20 μm, and a diameter in a range of 0.05 μm to 1 μm.

17. The epitaxy structure of claim 15, wherein the passivation film comprises an insulating crystalline material, a crystalline structure of the insulating crystalline material being same as a crystalline structure of a crystalline material of the light emitting layer.

18. The epitaxy structure of claim 17, wherein the passivation film has a lattice matching epitaxial relationship or a domain matching epitaxial relationship with the light emitting layer.

19. An epitaxy structure comprising:

a substrate comprising:

a single support layer; and a plurality of single crystal layers on the single support layer and spaced apart from each other, the plurality of single crystal layers having a single crystal structure comprising at least one single crystal of lithium fluoride (LiF) and barium titanate (BaTiO₃);

an insulating layer disposed on an upper surface of the substrate;

a plurality of two-dimensional material layers respectively disposed on the plurality of single crystal layers, the plurality of two-dimensional material layers being electrically isolated from each other by the insulating layer; and a plurality of semiconductor devices respectively disposed to correspond to the plurality of two-dimensional material layers, wherein a sidewall of each of the plurality of two-dimensional material layers and a sidewall of each of the corresponding plurality of semiconductor devices are coplanar.

20. The epitaxy structure of claim 19, wherein the plurality of semiconductor devices comprise different semiconductor materials.

21. The epitaxy structure of claim 19, wherein the plurality of semiconductor devices comprise any one of a light source, a photodetector, an optical modulator, and an optical amplifier.

22. A monolithic optical integrated circuit comprising an epitaxy structure comprising:

a substrate comprising:

a single support layer; and a plurality of single crystal layers on the single support layer and spaced apart from each other, the plurality of single crystal layers having a single crystal structure comprising at least one single crystal of lithium fluoride (LiF) and barium titanate (BaTiO₃);

an insulating layer disposed on an upper surface of the substrate;

a plurality of two-dimensional material layers respectively disposed on the plurality of single crystal layers, the plurality of two-dimensional material layers being electrically isolated from each other by the insulating layer; and a plurality of semiconductor devices respectively disposed on the plurality of two-dimensional material layers, wherein the plurality of semiconductor devices comprise one of a light source, a photodetector, an optical modulator, and an optical amplifier, and wherein a sidewall of each of the plurality of two-dimensional material layers and a sidewall of each of the corresponding plurality of semiconductor devices are coplanar.

* * * * *